United States Patent [19]

Ahn

[11] Patent Number: 5,877,525

[45] Date of Patent: Mar. 2, 1999

[54] FLASH EEPROM CELL AND METHOD OF MAKING THE SAME

[75] Inventor: Byung Jin Ahn, Seoul, Rep. of Korea

[73] Assignee: Hyundai Electronics Industries, Co., Ltd., Kyungki-Do, Rep. of Korea

[21] Appl. No.: 766,371

[22] Filed: Dec. 12, 1996

Related U.S. Application Data

[62] Division of Ser. No. 575,510, Dec. 20, 1995, Pat. No. 5,612,237.

[30] Foreign Application Priority Data

Dec. 23, 1994 [KR] Rep. of Korea .................... 94-36290

[51] Int. Cl.$^6$ .......................... H01L 29/76; H01L 29/788
[52] U.S. Cl. .......................... 257/321; 257/314; 257/315; 257/320
[58] Field of Search .................................... 257/314, 315, 257/320, 321, 324, 330, 331, 332, 647

[56] References Cited

U.S. PATENT DOCUMENTS

| 4,583,281 | 4/1986 | Ghezzo et al. ........................... 257/647 |
| 5,448,094 | 9/1995 | Hsu ......................................... 257/330 |

FOREIGN PATENT DOCUMENTS 405021789  1/1993  Japan ..................................... 257/330

OTHER PUBLICATIONS

IBM Technical Disclosure Bulletin, vol. 35 No. 4B, pp. 130–131, Sep. 1992.

*Primary Examiner*—Valencia Martin-Wallace
*Attorney, Agent, or Firm*—Scott C. Harris, Esq.

[57] ABSTRACT

A flash EEPROM cell according to the present invention is manufactured in accordance with the following processes: forming a oxide film on a portion of the silicon substrate by means of the LOCOS process using the patterned nitride film as an oxidation preventing layer; dry-etching a portion of the oxide film using the patterned nitride film as the etching mask; forming a tunnel oxide film, forming floating gates of a symmetric structure at the etched face; removing the patterned nitride film; forming source and drain regions by means of the self-aligned ion implantation method using the residual oxide film remaining below the patterned nitride film and the floating gates; removing the residual oxide film; forming a select channel region at this portion by means of the ion implantation process for controlling a threshold voltage; and then forming an interpoly oxide film and a control gate by means of the common processes.

1 Claim, 5 Drawing Sheets

5,877,525

FLASH EEPROM CELL AND METHOD OF MAKING THE SAME

This is a divisional of application Ser. No. 08/575,510, filed Dec. 20, 1995, now U.S. Pat. No. 5,612,237.

FIELD OF THE INVENTION

The present invention relates to a flash EEPROM cell and method of making the same and more particularly, in making a flash EEPROM cell having a split-gate structure, it relates to a flash EEPROM cell and method of making the same which enables the length of select channel to be constant by forming source and drain regions in the cell by means of the self-aligned ion implantation method using a floating gate.

BACKGROUND OF THE INVENTION

Generally, in the process of making a semiconductor device, an Electrically Erasable Read Only Memory (EEPROM) cell which has both functions of an electrical programming and an electrical erasure can have a stack-gate structure (FIG. 1) and a split-gate structure (FIG. 2).

Referring to FIG. 1, in a conventional flash EEPROM cell having a stack-gate structure, a tunnel oxide film 5, a floating gate 6, an interpoly oxide film 11 and a control gate 12 are sequentially stacked on a selected portion of a silicon substrate 1, and source and drain regions 7 and 8 are formed in the silicon substrate 1 by means of a conventional ion implantation method.

With reference to FIG. 2, in a conventional flash EEPROM cell having the split-gate structure, a tunnel oxide film 5 and a floating gate 6 are sequentially formed on a selected portion of a silicon substrate 1, an interpoly oxide film 11 is then formed on the upper portion of the floating gate 6 and a selected portion of the silicon substrate 1 left to the floating gate 6. A control gate 12 is formed on the interpoly oxide film 11, a source region 7 is formed in the silicon substrate 1 left to the floating gate 6 and a drain region 8 is then formed in the silicon substrate 1 right to the control gate 12. The silicon substrate 1 below the control gate 12 and between the floating gate 6 and the drain region 8 becomes a select channel region 9.

The stack-gate structure has an advantage in that a higher integration density in the device is made possible because it can form a unit cell at a limited area compared to the spilt-gate structure, but it has a disadvantage of an over-erasure in the erasure operation. Whereas, the split-gate structure can solve the problems of the stack-gate structure, but it has difficulties in accomplishing a higher integration density due to the increased area at a unit cell and in controlling the length of select channel to be constant.

SUMMARY OF THE INVENTION

Therefore, the purpose of the present invention is to provide a flash EEPROM cell having a split-gate structure and method of making the same by which the length of the select channel can be controlled to be constant and also a higher integration density in the device can be realized.

To accomplish the above object, a flash EEPROM cell according to the present invention, comprises:

a recess formed in a portion of a silicon substrate; first and second floating gates formed in the recess in symmetric structure, with the first and second floating gates electrically insulating from the silicon substrate by means of a tunnel oxide film; a drain region formed in the silicon substrate between the first floating gate and the second floating gate, with the drain region overlapping in part with each of the first and second floating gates; source regions spaced, in some distances, formed in the silicon substrate, with the source regions spacing from each of the first and second floating gates in constant distance; and a control gate formed on the upper portion of the silicon substrate and the floating gates with electrically insulating from the silicon substrate and each of the floating gates by an interpoly oxide film.

The method of making a flash EEPROM cell according to the present invention, comprises the steps of:

patterning the nitride film and the pad oxide film to open a portion of the silicon substrate; forming an oxide film in a portion of the silicon substrate by means of the oxidation process using the patterned nitride film as an oxidation preventing layer; etching the exposed portion of the oxide film by means of the etching process using the patterned nitride film as the etching mask to expose a portion of the silicon substrate, thereby forming a first and second residual oxide film below the patterned nitride film; forming a tunnel oxide film on the exposed silicon substrate; forming a first floating gate at the etching surface of the patterned nitride film and the first residual oxide film, and then forming a second floating gate at the etching surface of the patterned nitride film and the second residual oxide film; removing the patterned nitride film, and then forming source and drain regions by means of the self-aligned ion implantation method using the first and second floating gates and the first and second residual oxide films; removing the first and second residual oxide film and removing the exposed pad oxide film and the exposed tunnel oxide film; forming a select channel region in the silicon substrate by means of the ion implantation process for controlling a threshold voltage; and sequentially forming an interpoly oxide film and a control gate on the resulting structure after forming the select channel.

BRIEF DESCRIPTION OF THE DRAWINGS

For fuller understanding of the nature and objects of the invention, reference should be had to the following detailed description taken in conjunction with the accompanying drawings in which.

Similar reference characters refer to similar parts through the several views of the drawings.

DESCRIPTION OF THE INVENTION

Below, the present invention will be described in detail by reference to the accompanying drawings.

FIG. 3A through FIG. 3I are cross-sectional views of the device for explaining the method of making a flash EEPROM cell according to the present invention.

Figure 1:
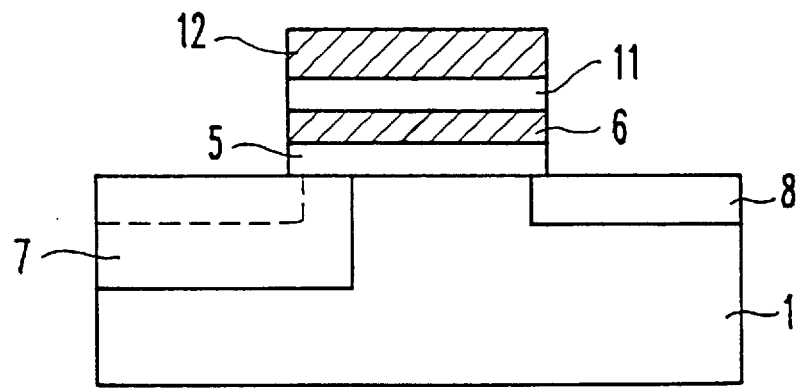
FIG. 1 is a cross-sectional view of a conventional flash EEPROM cell having a stack-gate structure.
Figure 2:
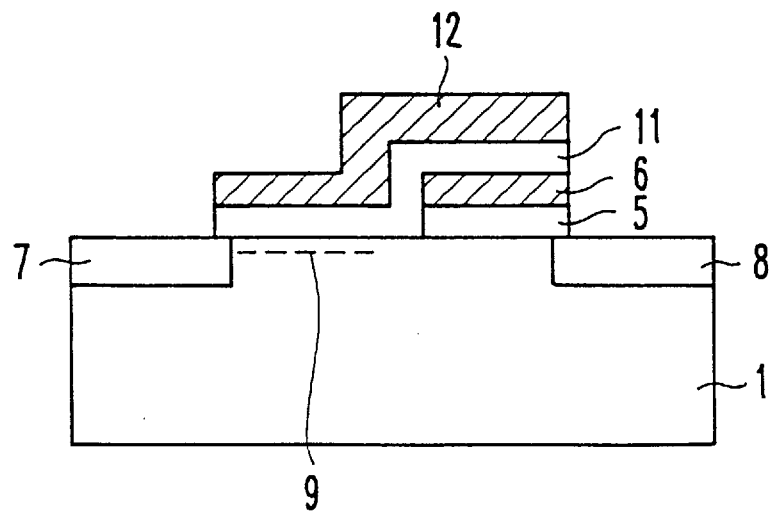
FIG. 2 is a cross-sectional view of a conventional flash EEPROM cell having a split-gate structure.
Figure 3A:
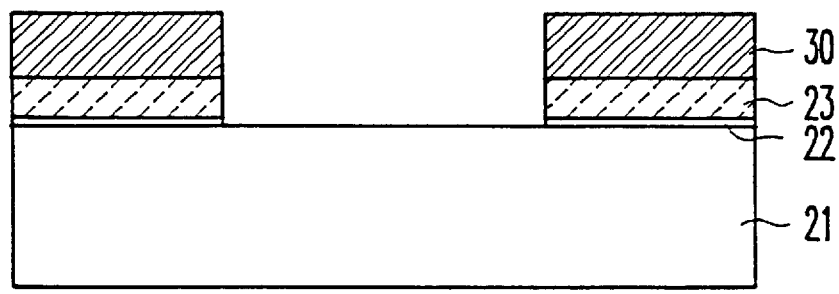
FIG. 3A through FIG. 3I are cross-sectional views of the device for explaining the method of making a flash EEPROM cell in accordance with this invention.

Referring to FIG. 3A, a pad oxide film 22 and a nitride film 23 are formed on a silicon substrate 21. A photoresist pattern 30 is formed on the nitride film 23. The nitride film 23 and the pad oxide film 22 are patterned by means of the etching process using the photoresist pattern 30 as the etching mask, thus a portion of the silicon substrate 21 is exposed.

Figure 3B:
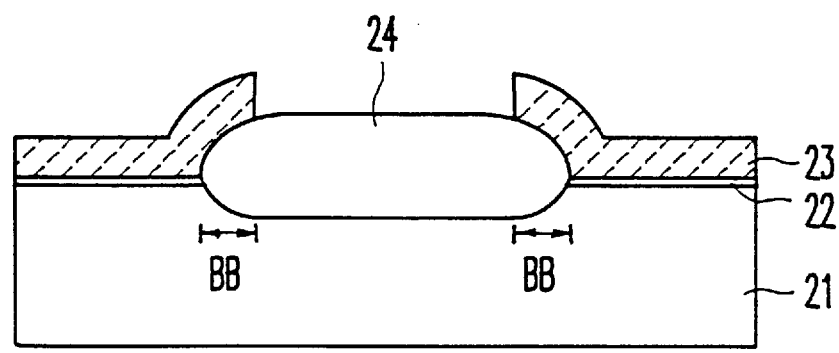

With reference to FIG. 3B, the photoresist pattern 30 is removed. An oxide film 24 is formed by means of the oxidation process using nitride film 23 patterned by the etching process as an oxidation prevention layer, for example LOCOS (Local Oxidation of Silicon) process. The oxide film 24 is formed in thickness of 2000 to 4000 Å, and on both sides of the oxide film 24 is created so called a bird's beak (BB).

Figure 3C:
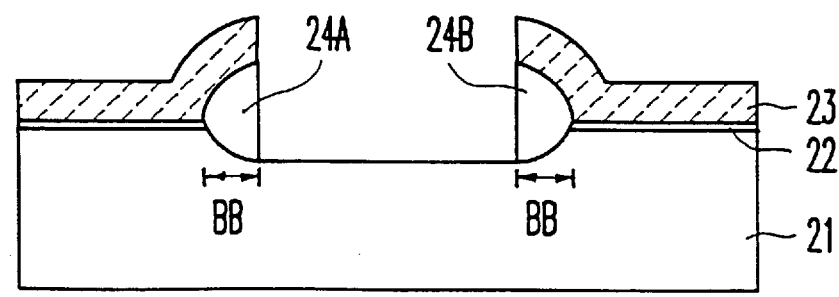

Referring to FIG. 3C, as the exposed portion of the oxide film 24 is etched by means of the etching process using the patterned nitride film 23 as the etching mask, thereby exposing a portion of the silicon substrate 21 and forming first and second residual oxide films 24A and 24B having a symmetric structure with the bird's beak (BB) portion in the oxide film 24 being left. The etching process for the oxide film 24 is performed by means of the dry etching method having a high rate of oxide film etching selection.

Figure 3D:
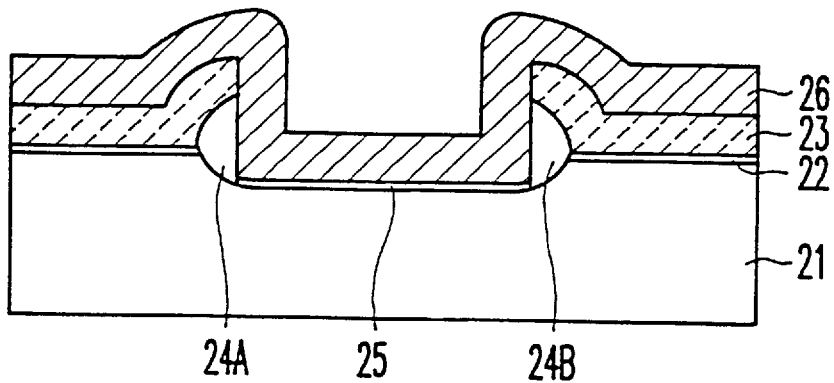

Referring to FIG. 3D, a tunnel oxide film 25 is formed on the exposed silicon substrate 21 in thickness of 70 to 130 Å. A first polysilicon layer 26 is formed on the resulting structure after forming the tunnel oxide film 25.

Figure 3E:
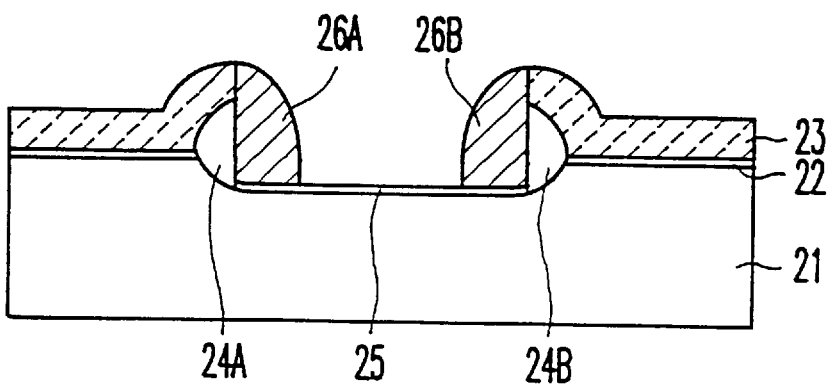

With reference to FIG. 3E, the first polysilicon layer 26 is etched by means of the blanket dry etching process, whereby first and second floating gates 26A and 26B having a symmetric structure are formed. The first floating gate 26A is formed on the etching surfaces of the patterned nitride film 23 and the first residual oxide film 24A in a spacer form, and also the second floating gate 26B is formed on the etching surfaces of the patterned nitride film 23 and the second residual oxide film 24B in a spacer form. Each of the first and second floating gates 26A and 26B is electrically insulated from the silicon substrate 21 by the tunnel oxide film 25.

Figure 3F:
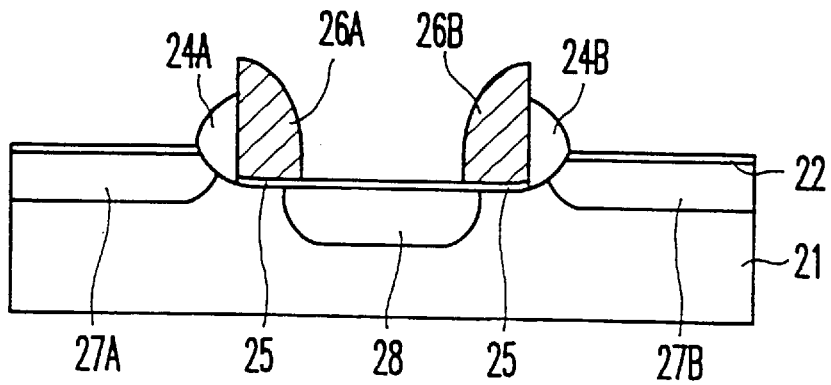

Referring to FIG. 3F, the patterned nitride film 23 is removed. N-type impurity having a high concentration is implanted into the silicon substrate 21 by means of the self-aligned ion implantation method using the first and second floating gates 26A and 26B and the first and second residual oxide films 24A and 24B, thereby forming a drain region 28, a first source region 27A and a second source region 27B in the silicon substrate 21. The drain region 28 is formed in the silicon substrate 21 between the first floating gate 26A and the second floating gate 26B. The first source region 27A is formed in the silicon substrate 21 outside the first residual oxide film 24A and also the second source region 27B is formed in the silicon substrate 21 outside the second residual oxide film 24B. The drain region 28 overlaps with each edge portion of the first and second floating gates 26A and 26B. The first and second source regions 27A and 27B is formed in symmetric structure.

Figure 3G:
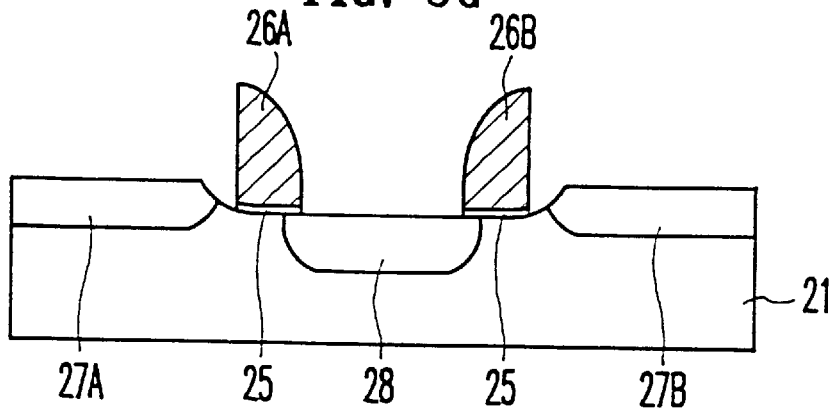

With reference to FIG. 3G, the first and second residual oxide films 24A and 24B are removed by means of the wet etching method and also the exposed pad oxide film 22 and the exposed tunnel oxide film 25 are removed together with the first and second residual oxide films 24A and 24B.

Figure 3H:
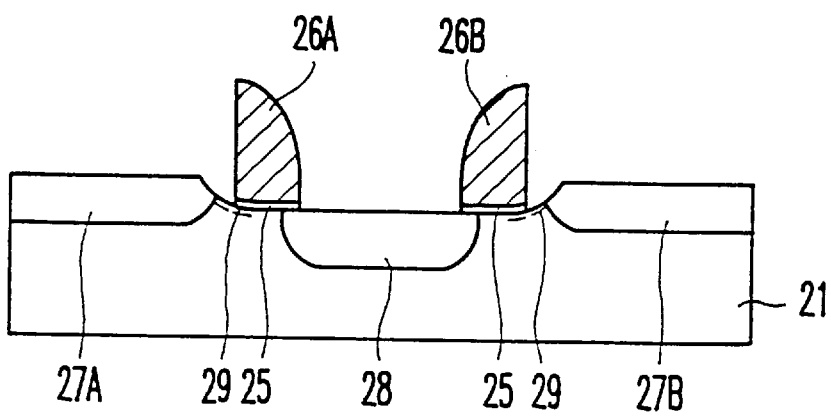

Referring to FIG. 3H, select channel regions 29 for controlling a threshold voltage are formed in the silicon substrate 21 adjacent to the first and second source regions 27A and 27B by means of the ion implantation process, respectively.

Figure 3I:
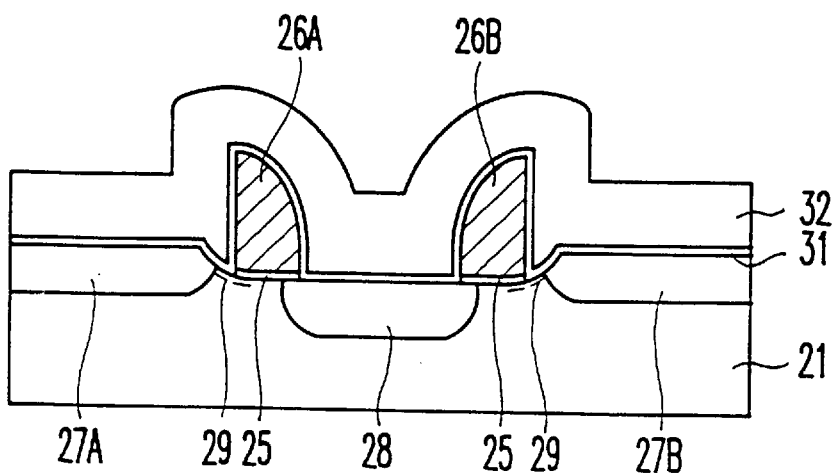

Referring to FIG. 3I, an interpoly oxide film 31 is formed on a resulting structure after forming the channel regions 29.

A control gate 32 is formed on the interpoly oxide film 31 by depositing a second polysilicon on the interpoly oxide film 31 and patterning the second polysilicon. A load oxide film is then formed by means of the conventional processes and thus a flash EEPROM cell is completed by means of the metal process.

In the flash EEPROM cell being manufactured by the above processes, the oxide film 24 is formed on a portion of the silicon substrate 21 by means of the LOCOS process and the oxide film 24 is then removed, thereby forming a recess in a portion of the silicon substrate 21. The two floating gates 26A and 26B having a symmetric structure are formed in the silicon substrate 21 within the recess. A drain region 28 which overlaps in part with each of the two floating gates 26A and 26B is formed in the silicon substrate 21 between the two floating gates 26A and 26B. A source regions 27A and 27B are formed on the silicon substrate 21 outside the recess respectively, and the control gate 32 is formed in the upper portion of the silicon substrate 21 including the source and drain regions 27A, 27B and 28 and the upper portion of the two floating gates 26A and 26B.

Each of the floating gates 26A and 26B is electrically insulated from the silicon gate 21 by the tunnel oxide film 25. The control gate 32 is electrically insulated from each of the silicon substrate 21 and the floating gate 26A and 26B by the interpoly oxide film 31.

Figure 4A:
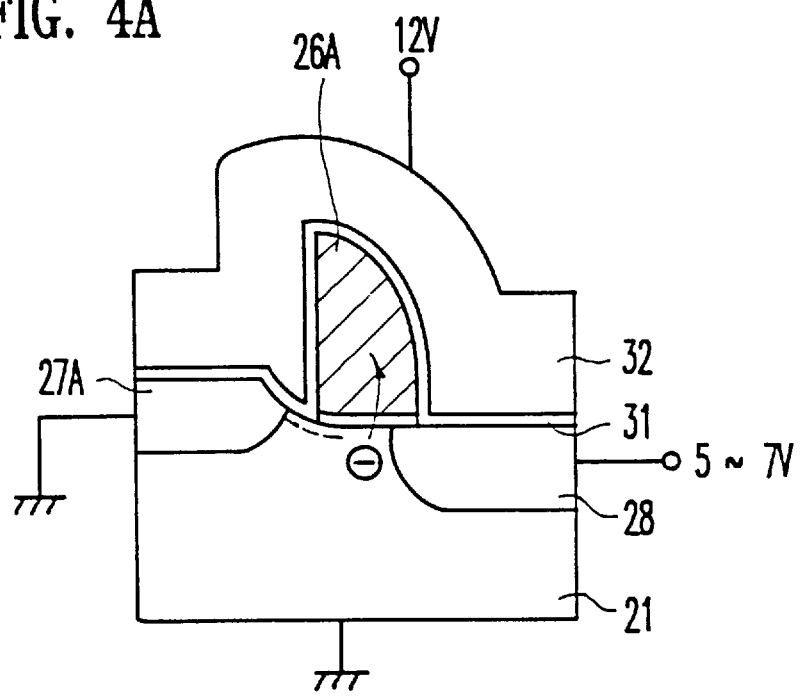
FIG. 4A and FIG. 4B show schematic diagrams for explaining an electrical operation of a flash EEPROM cell manufactured by the present invention.
Figure 4B:
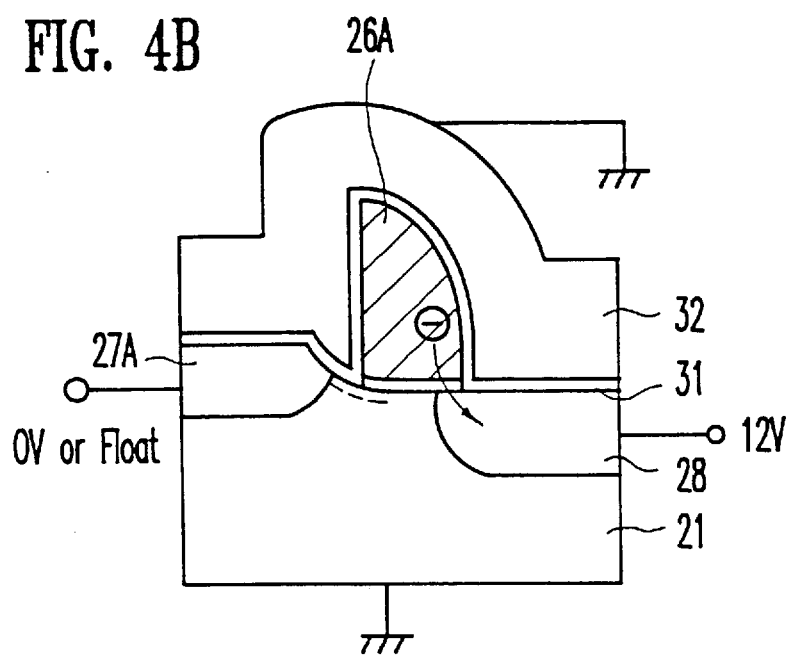

FIG. 4A and FIG. 4B show schematic diagram for explaining an operation of a flash EEPROM cell manufactured by the present invention.

Referring to FIG. 4A, the silicon substrate 21 and the source region 27 are grounded and about 5 to 7 V voltage is applied to the drain region 28. In this state, when the high voltage of about 12 V is applied to the control gate 32, a channel is formed on the surface of the silicon substrate 21 between the source region 27 and the drain region 28 and then hot electrons are emitted from the channel which is junctioned with the drain region 28. As the emitted hot electrons are stored in the floating gate 26A, the program of the flash EEPROM cell is completed.

Referring to FIG. 4B, in a state in which the silicon substrate, the source region and the control gate 21, 27 and 32 are grounded, when the high voltage of about 12 V is applied to the drain region 28, the electrons stored at the floating gate 26A are emitted by means of localized high electron field between the drain region 28 and the floating gate 26A and thus the erasure for the flash EEPROM cell is completed.

As described above, in making a flash EEPROM cell of a split-gate structure, as the source and drain regions of the cell are formed by means of the self-aligned ion implantation method using the floating gates, the present invention has an excellent effect by which the characteristic drop of the cell due to the variations in the length of the select channel can be prevented.

The foregoing description, although described in its preferred embodiment with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

I claim:

1. A flash EEPROM cell, comprising: a silicon substrate; a recess formed in a portion of said silicon substrate by means of the local oxidation of silicon (LOCOS) process and an oxide removal process;

a symmetric structure of first and second floating gates formed in said recess, wherein said first and second floating cates are formed in a spacer form;

a tunnel oxide film electrically insulating said first and second floating gates from said silicon substrate;

a drain region formed in said silicon substrate between said first and second floating gates, with said drain region overlapping in part with each of said first and second floating gates;

two source regions formed in said silicon substrate, wherein said source regions are horizontally spaced from both sides of said drain region;

a control gate formed on the upper portion of said silicon substrate and said first and second floating gates; and an interpoly oxide film electrically insulating said control gate from said silicon substrate and said first and second floating gates.

\* \* \* \* \*